US008524523B2

(12) United States Patent
Park

(10) Patent No.: US 8,524,523 B2
(45) Date of Patent: Sep. 3, 2013

(54) SQUARE PILLAR-SHAPED SWITCHING ELEMENT FOR MEMORY DEVICE AND METHOD OF MANUFACTURING THE SAME

(75) Inventor: Hae Chan Park, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 872 days.

(21) Appl. No.: 12/552,424

(22) Filed: Sep. 2, 2009

(65) Prior Publication Data
US 2010/0252831 A1 Oct. 7, 2010

(30) Foreign Application Priority Data

Apr. 3, 2009 (KR) .................. 10-2009-0029066

(51) Int. Cl.
H01L 21/00 (2006.01)
(52) U.S. Cl.
USPC ....... 438/95; 438/381; 438/385; 438/E21.364

(58) Field of Classification Search
USPC ................ 438/95, 381, 385; 257/E21.364
See application file for complete search history.

(56) References Cited

U.S. PATENT DOCUMENTS
3,906,540 A 9/1975 Hollins

FOREIGN PATENT DOCUMENTS
KR 1020040107487 A 12/2004
KR 10-0781982 B1 11/2007

Primary Examiner — Samuel Gebremariam
(74) Attorney, Agent, or Firm — Ladas & Parry LLP

(57) ABSTRACT

A switching element for a memory device includes a base layer including a plurality of line-type trenches. First insulation patterns are formed on the base layer excluding the trenches. First diode portions are formed on the bottoms of the trenches in the form of a thin film. Second insulation patterns are formed on the first diode portions and are spaced apart from each other to form holes in the trenches having the first diode portions provided therein. Square pillar-shaped second diode portions are formed in the holes over the first diode portions.

11 Claims, 17 Drawing Sheets

SQUARE PILLAR-SHAPED SWITCHING ELEMENT FOR MEMORY DEVICE AND METHOD OF MANUFACTURING THE SAME

CROSS-REFERENCES TO RELATED APPLICATIONS

The present application claims priority to Korean patent application number 10-2009-0029066 filed on Apr. 3, 2009, which is incorporated herein by reference in its entirety.

BACKGROUND OF THE INVENTION

The present invention relates generally to a switching element for a memory device and a method of manufacturing the same, and more particularly, to a square pillar-shaped switching element for a memory device and a method of manufacturing the same.

Recently, research has been conducted with the hope of developing a novel memory devices which has the characteristics of a nonvolatile memory device, can be highly integrated, and has a simple structure. One group of novel memory devices studied is the phase-change memory device.

Generally, in a phase-change memory device a phase-change film is interposed between upper and lower electrodes. The phase change film is reversible changed from an ordered crystalline solid state to a disordered amorphous solid state by the flowing of current between the upper and lower electrodes. The phase-change memory device can thus serve as a memory device by exploiting the variable physical properties, e.g., a variable resistance, of the phase-change film to distinguish the information stored in cells. For example, the difference in resistance between the crystalline phase-change film and the amorphous phase-change film can be used to determine the logic level of information stored in cells.

One of the most important design factors that must be given consideration when developing a phase-change memory device is the minimization of a programming current. One method of reducing programming current is to substitute transistors with vertical type PN diodes for use as a cell switching element. Vertical type PN diodes are considered advantageous for their use as a cell switching element since the vertical type PN diodes enable current to easily flow when compared to transistors, thereby resulting in a reduction of programming current. Further, vertical type PN diodes enable a reduced cell size, and thus the application of the vertical type PN diodes facilitates high integration of the phase-change memory device.

However, a conventional phase-change memory device employing PN diodes as a switching element is problematic in that parasitic bipolar junction transistors are formed between the PN diodes and a P-type substrate, thus incurring the loss of driving current.

Further, the conventional phase-change memory device comprising the PN diodes has a structure in which PN diodes are electrically interconnected through an N+ region formed on a surface of an active region. As a consequence of this structure, the resistance of the N+ region becomes high, causing variations in the driving currents between cells, and thus it is required to improve the design and process thereof.

Moreover, the conventional phase-change memory device comprising the PN diodes is problematic in that its manufacturing process is complex, because complicated unit processes, such as an epitaxial process and the like, must be performed in order to form the PN diodes.

Furthermore, in the conventional phase-change memory device comprising the PN diodes, word line contacts for connecting word lines to a silicon substrate are formed in order to solve the problems attributable to the high resistance of the silicon substrate. However, this causes an increase in the number of processes required to manufacture the phase-change memory device and an increase in the area consumed by the phase-change memory device, thereby decreasing economical efficiency.

Meanwhile, in order to solve the problems attributable to high resistance of the silicon substrate, Schottky diodes are used as a switching element of a phase-change memory device. The phase-change memory device using the Schottky diodes as the switching element can decrease the resistance of the silicon substrate by three fold.

These Schottky diodes are formed in holes formed using a hole-type mask in the form of a round column. However, in a memory device to which 4F2 technology is applied, it is difficult to form small-sized Schottky diodes.

In other words, with the increase of high-integration of a memory device, it is very difficult to realize small-sized holes, which are Schottky diode formation regions, through an exposure process. Further, the distance between the holes is decreased, whereby the margin of a photosensitive film is also decreased, causing a hole patterning process to gradually become more difficult.

In addition, since the holes, which are Schottky diode formation regions, are formed through an insulating film patterning process, there are problems in that the holes cannot be stably formed in desired regions and can instead be formed in a misaligned state, and in that the characteristics of the Schottky diode can be deteriorated.

SUMMARY OF THE INVENTION

Embodiments of the present invention provide a switching element for a memory device, which can prevent a difference in driving current between cells, and a method of manufacturing the same.

Further, embodiments of the present invention provide a switching element for a memory device, which decrease a required number of processes and the area thereof, and a method of manufacturing the same.

Furthermore, embodiments of the present invention provide a switching element for a memory device, in which small-sized diodes are formed to facilitate high-integration of a memory device, and a method of manufacturing the same.

In an aspect, the present invention provides a switching element for a memory device comprising: a base layer including a plurality of line-type trenches; first insulation patterns formed on the base layer excluding the trenches; first diode portions formed on the bottoms of the trenches in the form of a thin film; second insulation patterns formed in the trenches on the first diode portions and spaced apart from each other so as to form holes in each of the trenches; and square pillar-shaped second diode portions formed in the holes such that they are brought into contact with the first diode portions.

The base layer including the trenches may be composed of an oxide film.

The trenches may have a right-angled inclination.

The first insulation patterns may be composed of any one selected from among an amorphous carbon film, a nitride film, a silicon nitride film, and a poly film.

The first diode portions may be composed of a metal film.

The metal film may be made of any one selected from among aluminum (Al), tungsten (W), cobalt (Co), nickel (Ni) and copper (Cu).

The second insulation patterns may be composed of an oxide film.

The second diode portions may be composed of a P-type polysilicon film.

The second diode portions may be composed of an N-type polysilicon film.

The switching element for a memory device may further comprise: barrier layers interposed between the first diode portions and the second diode portions.

The barrier layers may be made of any one selected from among titanium silicide ($TiSi_2$), tungsten silicide ($WSi_2$), cobalt silicide ($CoSi_2$), nickel silicide ($NiSi_2$) and titanium nitride (TiN).

In another aspect, the present invention provides a method of manufacturing a switching element for a memory device, comprising the steps of: forming line-type hard mask patterns spaced apart from each other at regular intervals on a base layer; etching the base layer exposed by the hard mask patterns to form a plurality of line-type trenches; forming first diode portions on the bottoms of the trenches; embedding an insulation material in the trenches having the first diode portions provided therein; forming line-type mask patterns spaced apart from each other at regular intervals on the hard mask patterns and insulation material in a direction perpendicular to the hard mask patterns; removing the insulation material exposed by the mask patterns to form holes exposing the surfaces of the first diode portions; removing the mask patterns; and forming second diode portions in the holes.

The base layer may be composed of an oxide film.

The hard mask patterns may be composed of any one selected from among an amorphous carbon film, a nitride film, a silicon nitride film, and a poly film.

The first diode portions may be made of a metal material.

The metal material may include any one selected from among aluminum (Al), tungsten (W), cobalt (Co), nickel (Ni) and copper (Cu).

The insulation material may include oxides.

The mask patterns may include photosensitive film patterns.

The method of manufacturing a switching element for a memory device may further comprise the step of: forming barrier layers on the first diode portions, between the step of removing the mask patterns and the step of forming the second diode portions in the holes.

The barrier layers may be made of any one selected from among titanium silicide ($TiSi_2$) tungsten silicide ($WSi_2$) cobalt silicide ($CoSi_2$), nickel silicide ($NiSi_2$) and titanium nitride (TiN).

The second diode portions may be composed of a P-type polysilicon film or an N-type polysilicon film.

DESCRIPTION OF SPECIFIC EMBODIMENTS

Hereinafter, preferred embodiments of the present invention will be described in detail with reference to the attached drawings. The drawings are not necessarily to scale and in some instances proportions may have been exaggerated in order to more clearly depict certain features of the invention.

Figure 1:
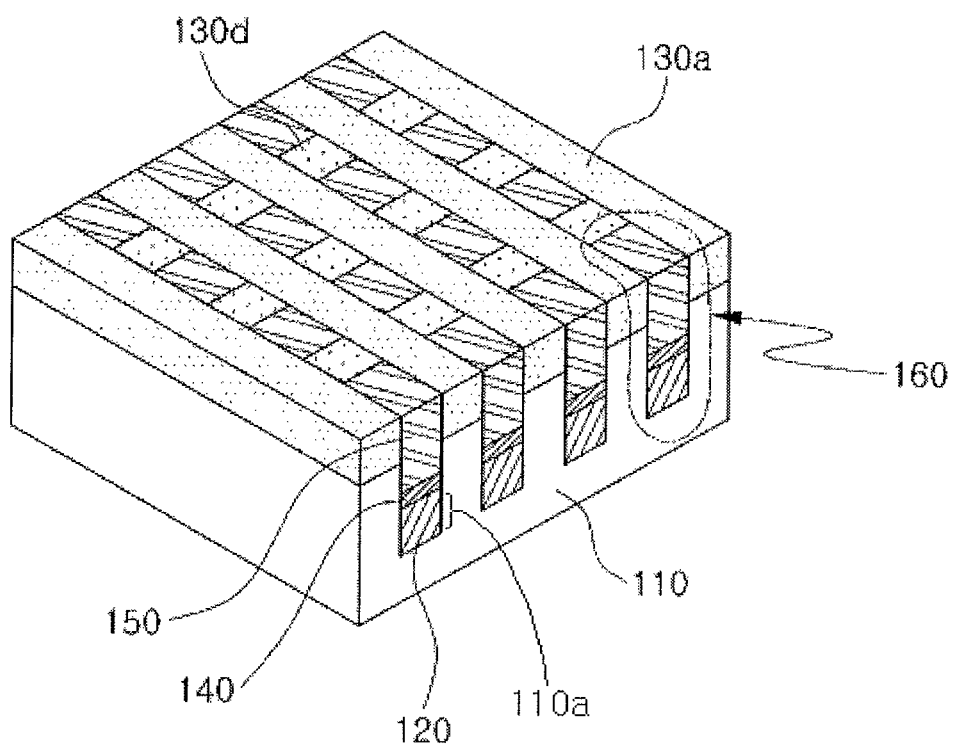
FIG. 1 is a perspective view showing a switching element for a memory device according to an embodiment of the present invention.
Figure 2A:
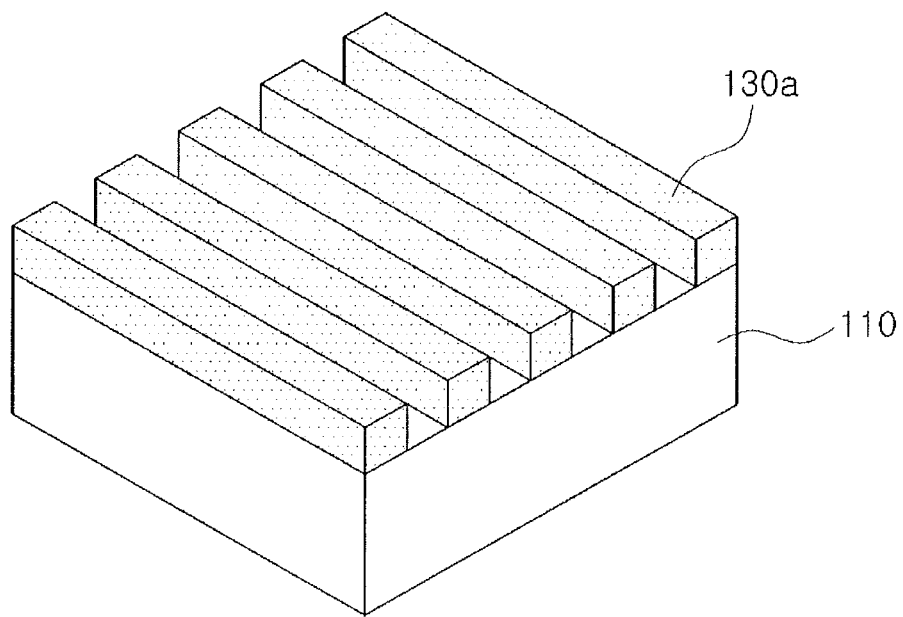
FIGS. 2A to 2H are cross-sectional views shown for explaining a method of manufacturing a switching element for a phase-change memory device according to an embodiment of the present invention.
Figure 2B:
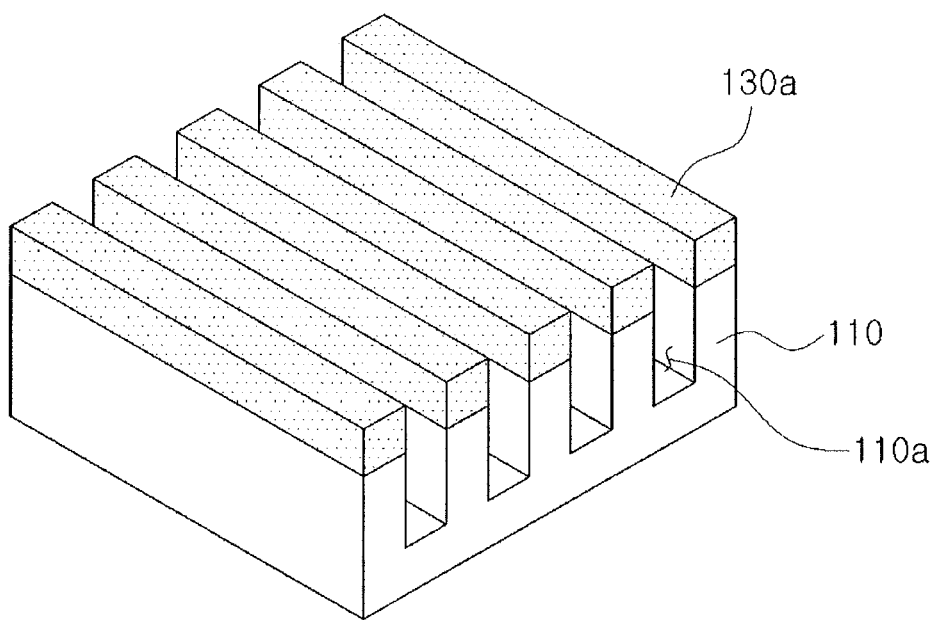
Figure 2C:
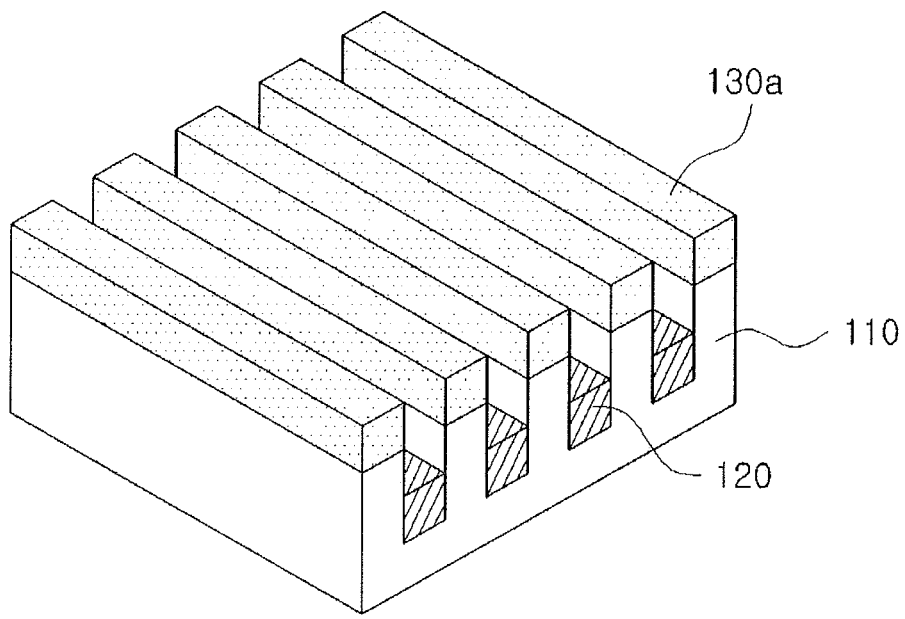
Figure 2D:
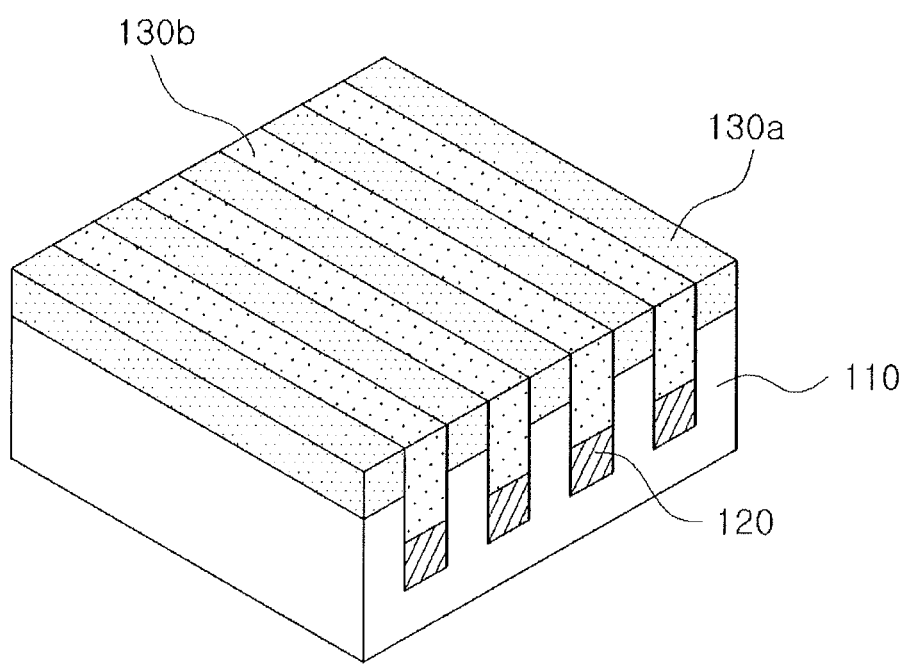
Figure 2E:
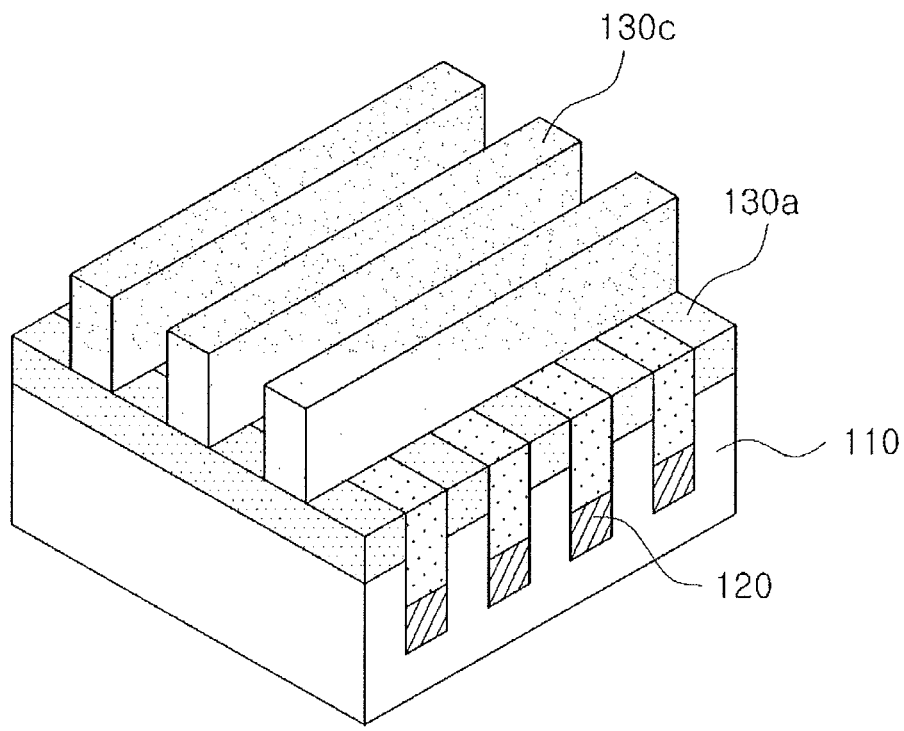
Figure 2F:
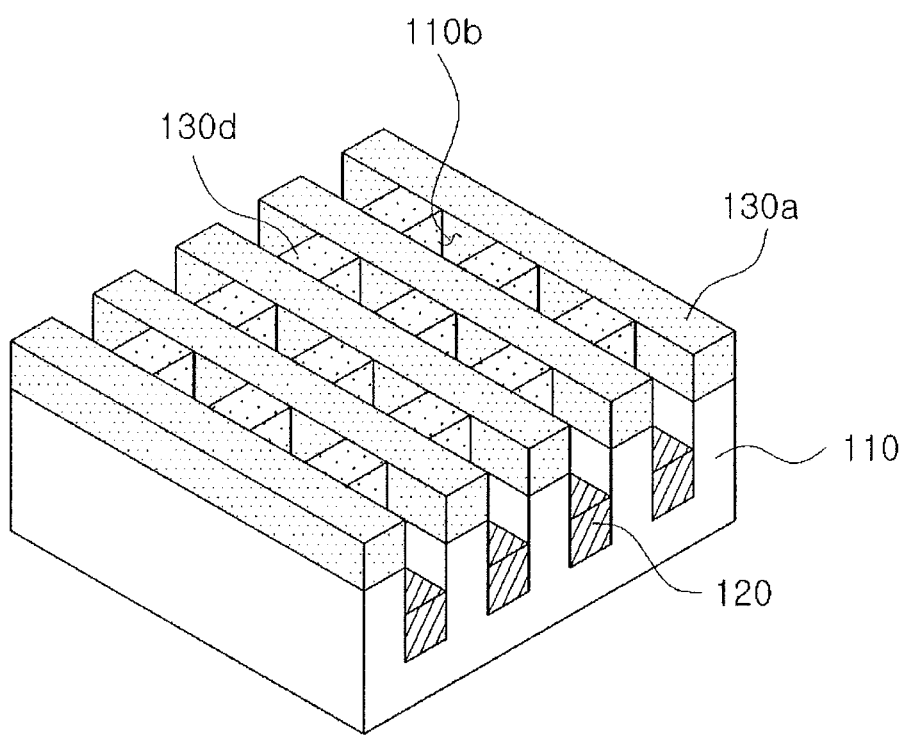
Figure 2G:
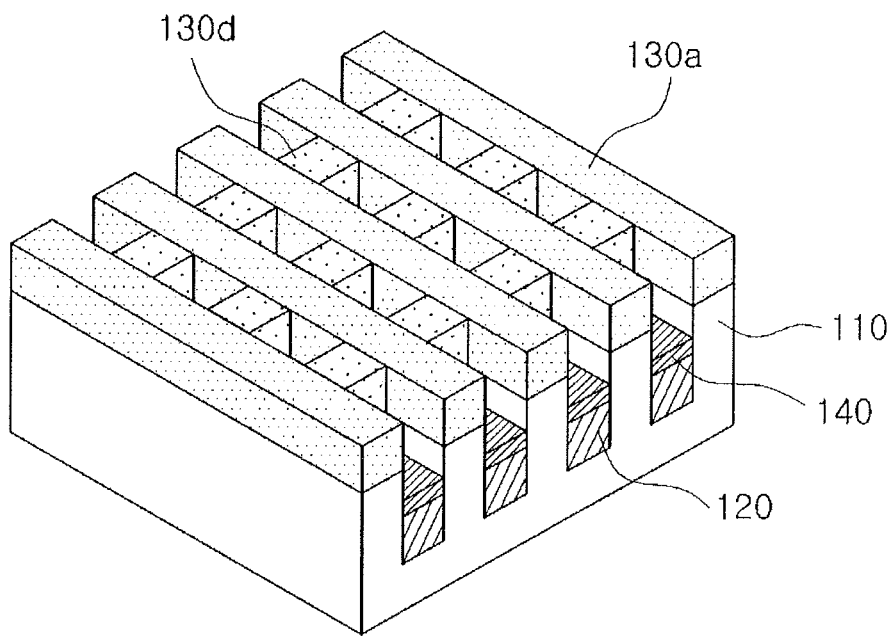
Figure 2H:
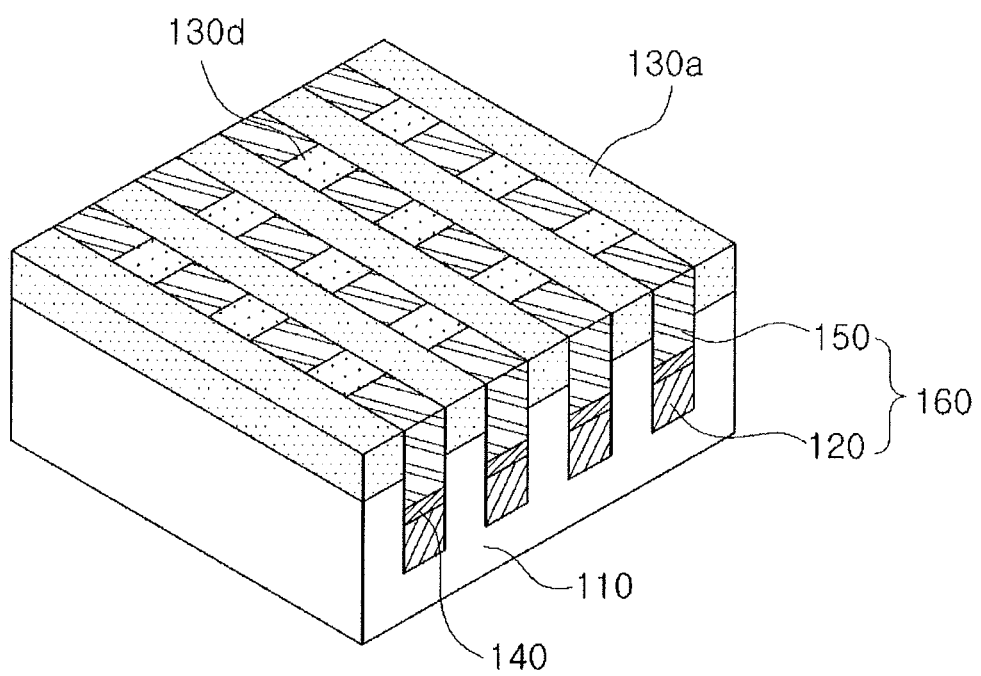
Figure 3A:
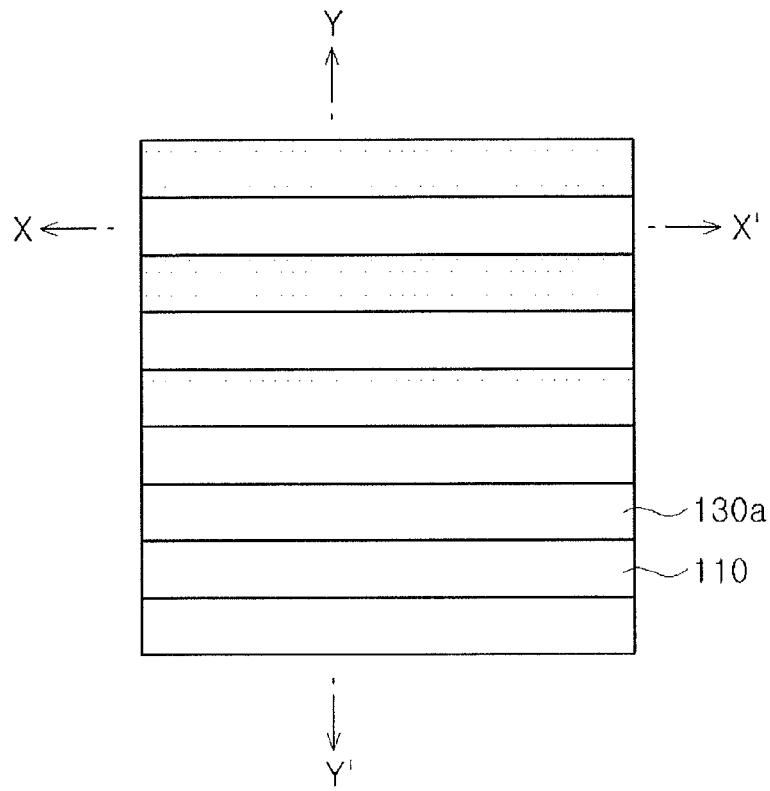
FIGS. 3A to 3H are plan views shown for explaining a method of manufacturing a switching element for a phase-change memory device according to an embodiment of the present invention.
Figure 3B:
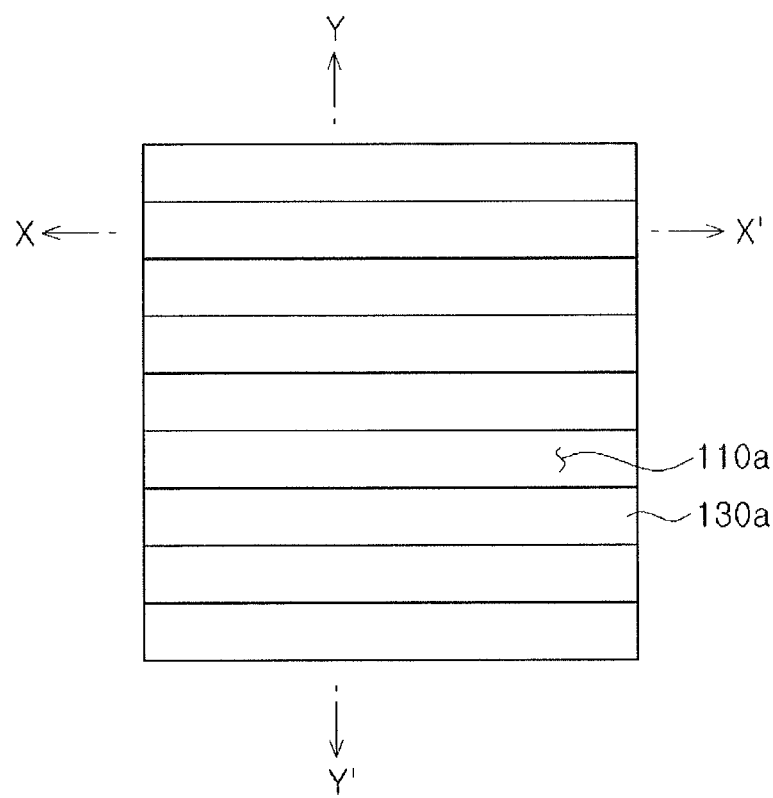
Figure 3C:
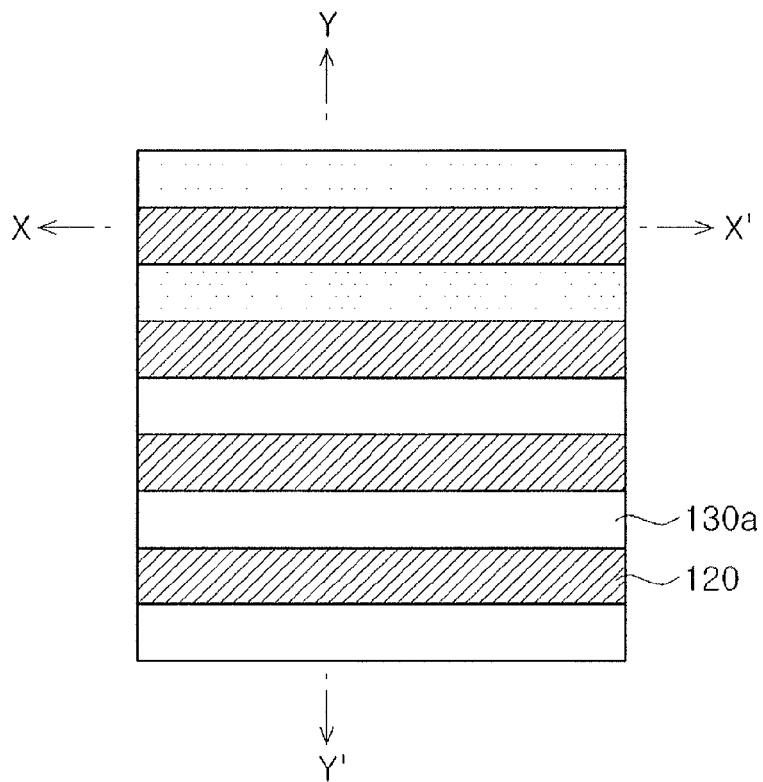
Figure 3D:
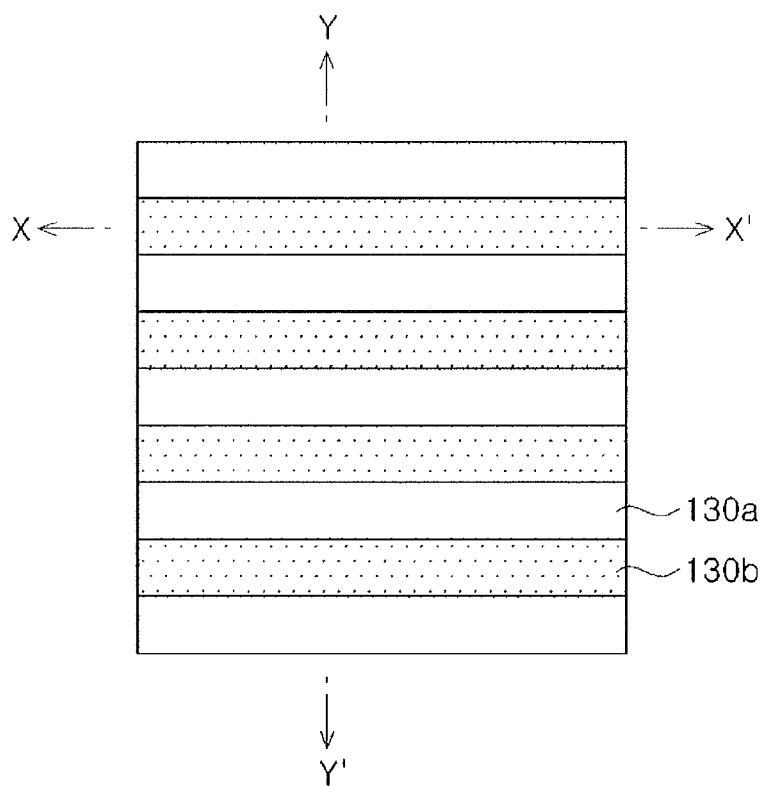
Figure 3E:
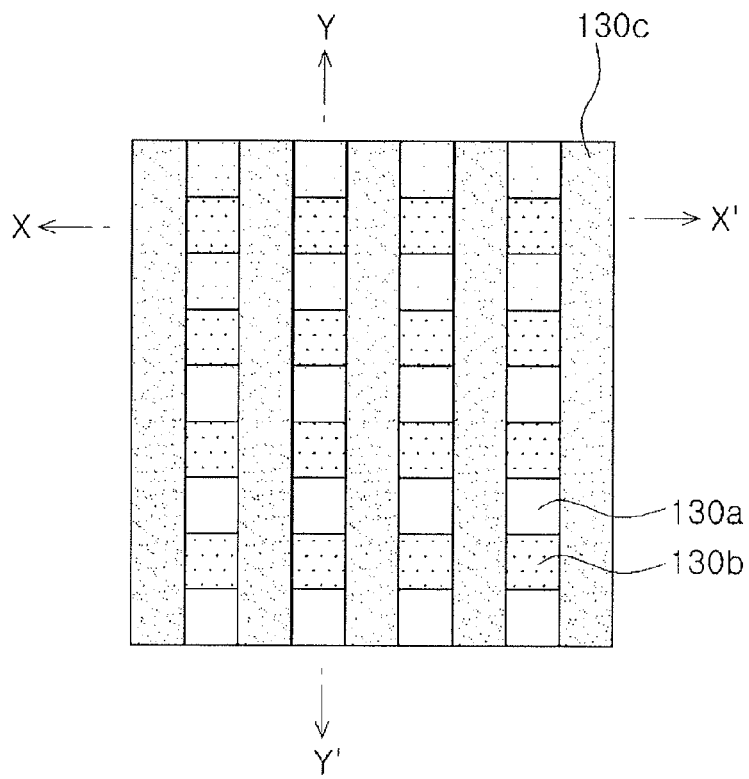
Figure 3F:
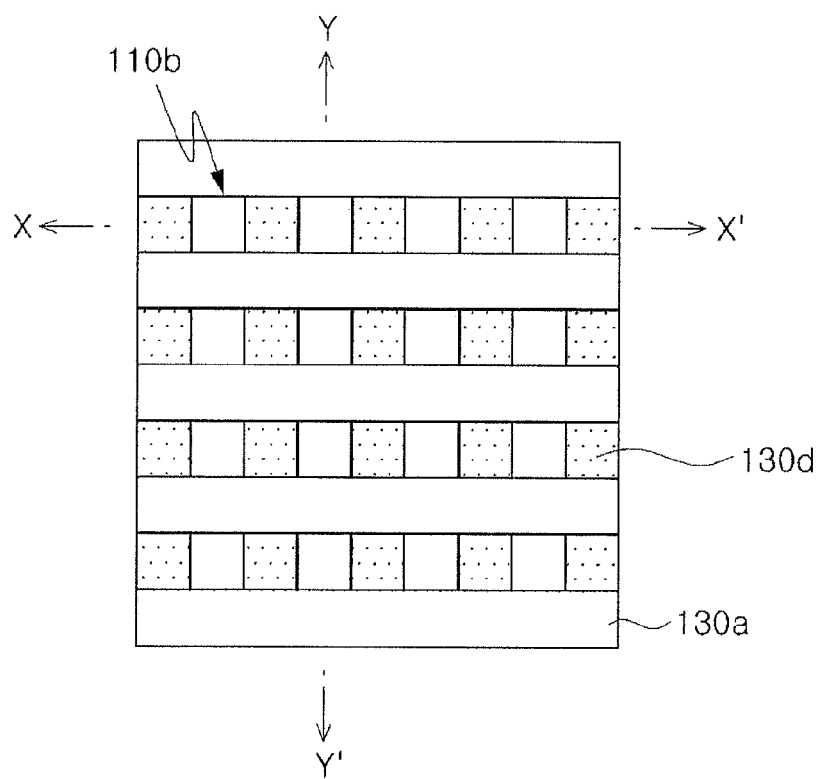
Figure 3G:
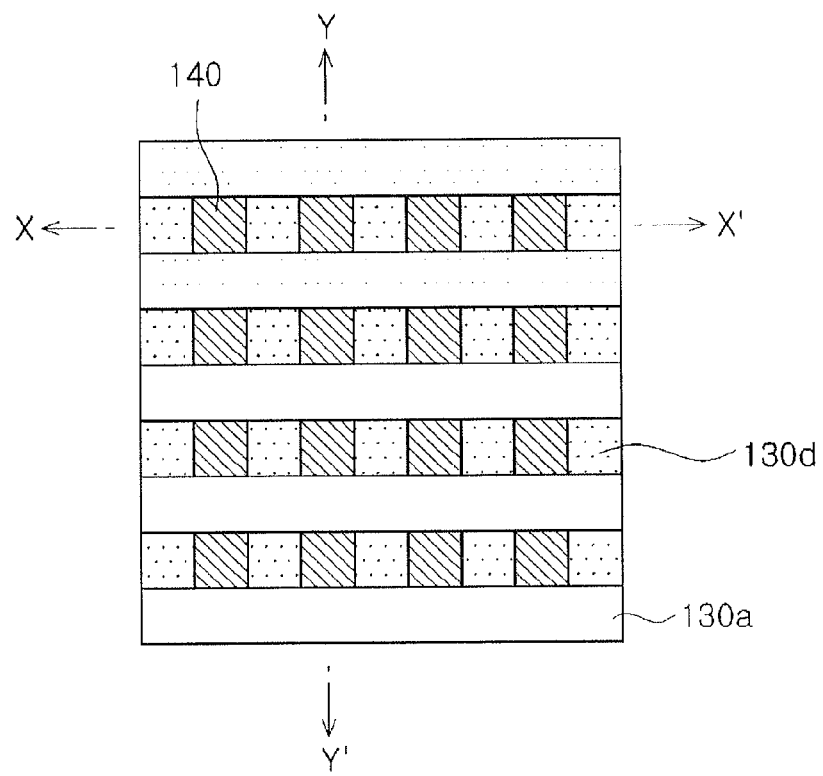
Figure 3H:
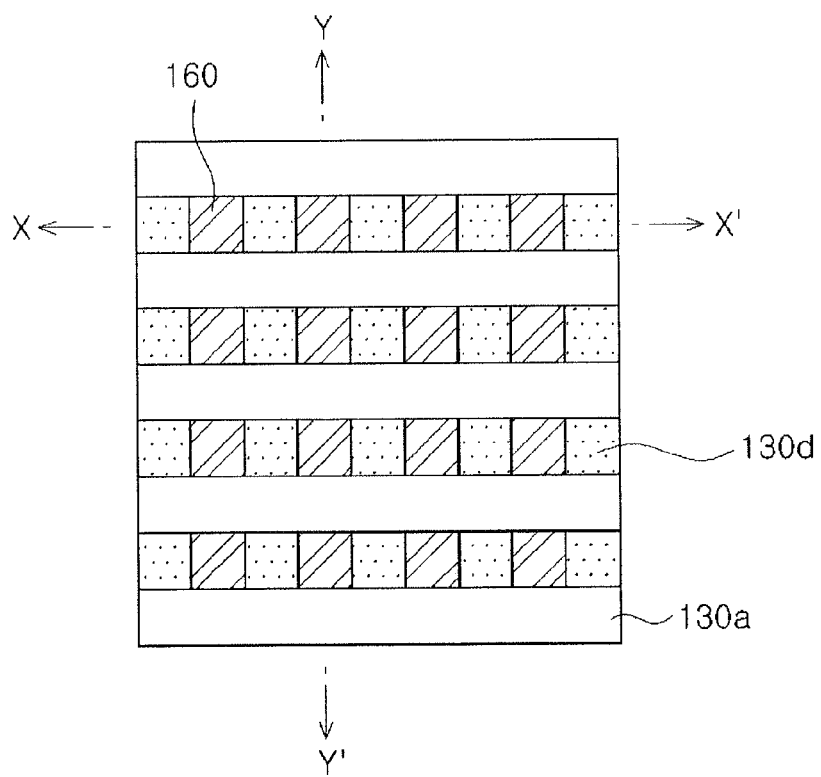
Figure 4A:
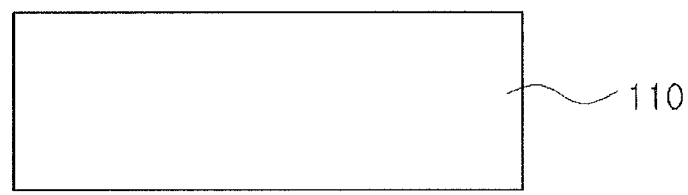
FIGS. 4A to 4H are cross-sectional views taken along the lines X-X' of FIGS. 3A to 3H for explaining a method of manufacturing a switching element for a phase-change memory device according to an embodiment of the present invention.
Figure 4B:
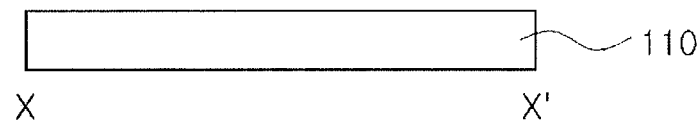
Figure 4C:
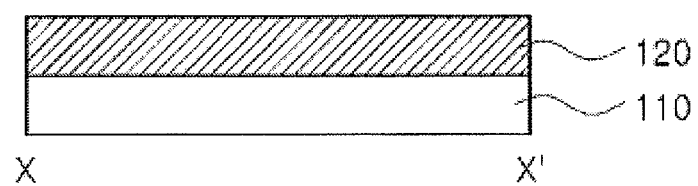
Figure 4D:
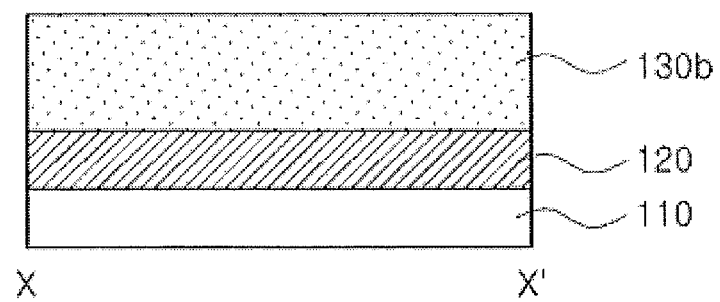
Figure 4E:
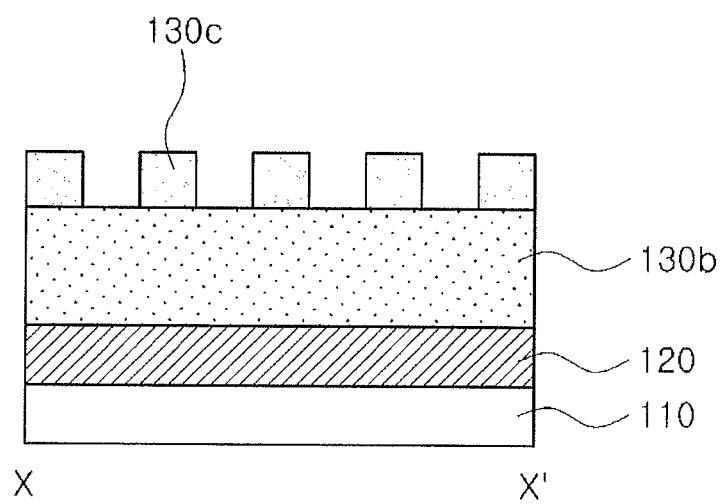
Figure 4F:
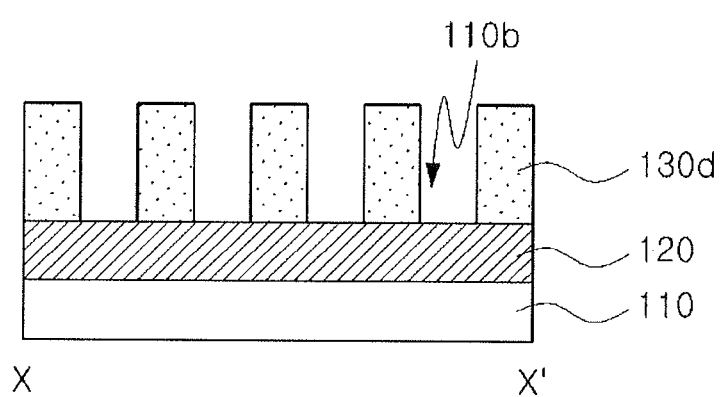
Figure 4G:
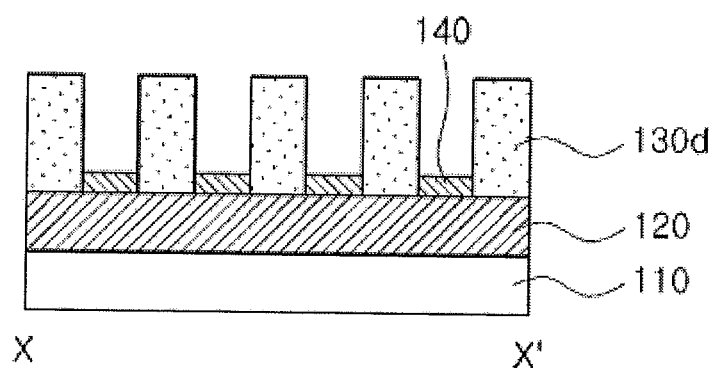
Figure 4H:
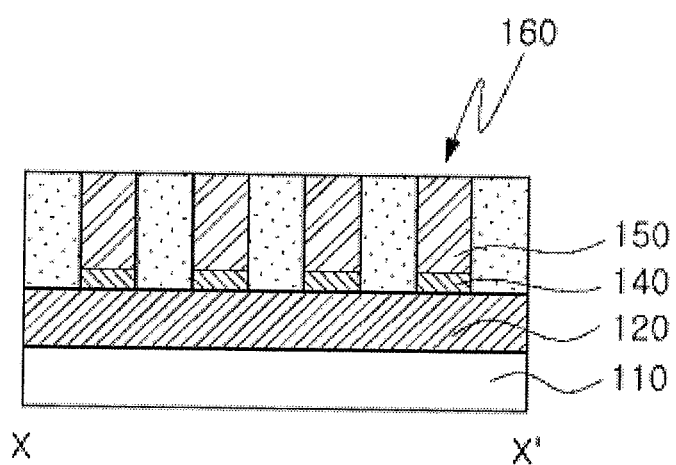
Figure 5A:
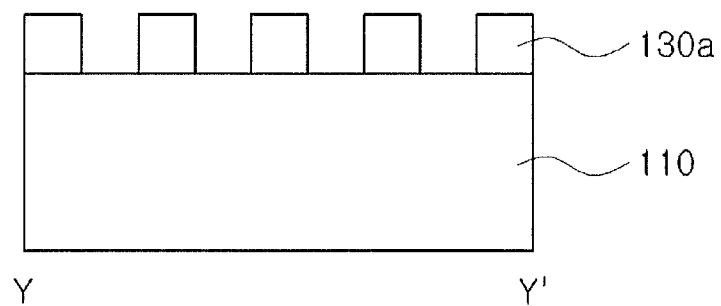
FIGS. 5A to 5H are cross-sectional views taken along the lines Y-Y' of FIGS. 3A to 3H for explaining a method of manufacturing a switching element for a phase-change memory device according to an embodiment of the present invention.
Figure 5B:
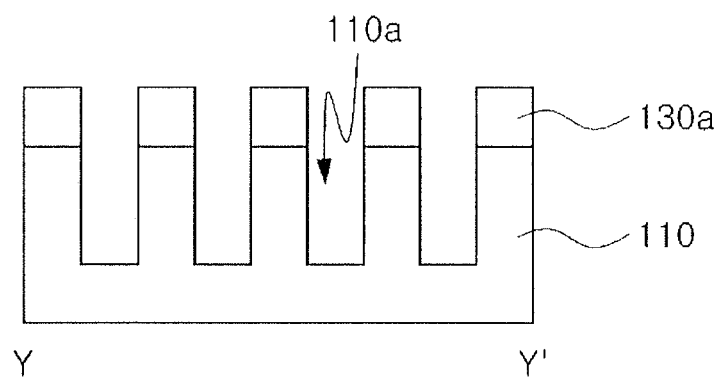
Figure 5C:
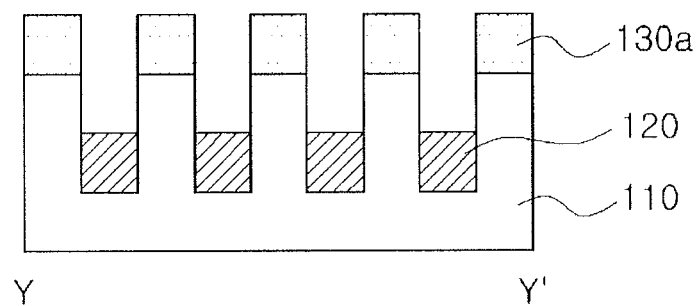
Figure 5D:
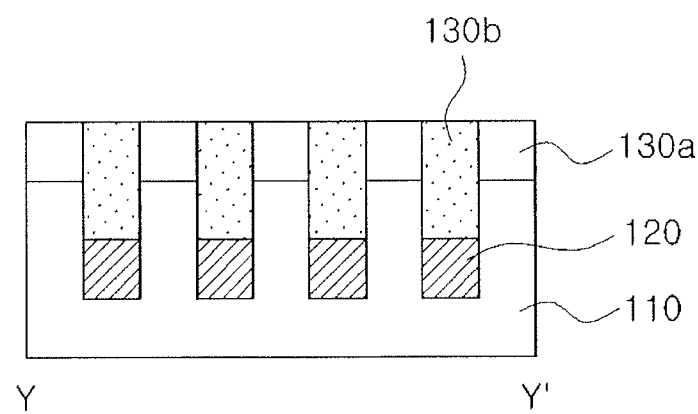
Figure 5E:
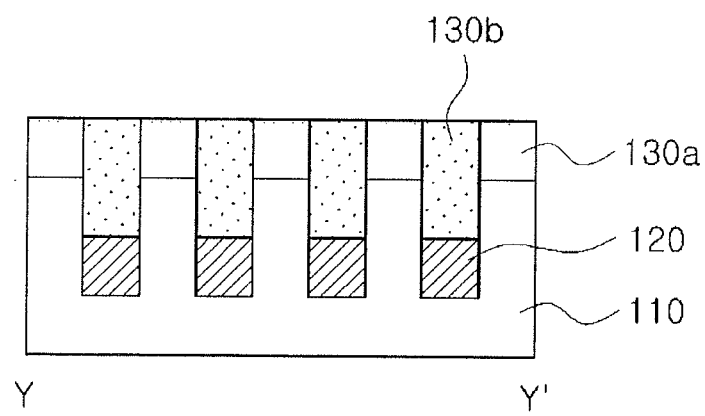
Figure 5F:
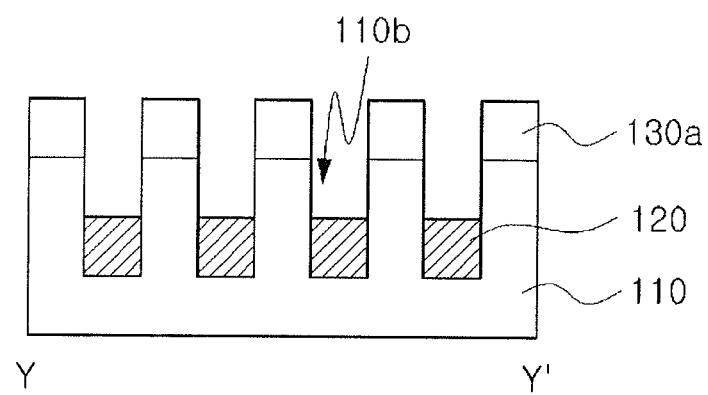
Figure 5G:
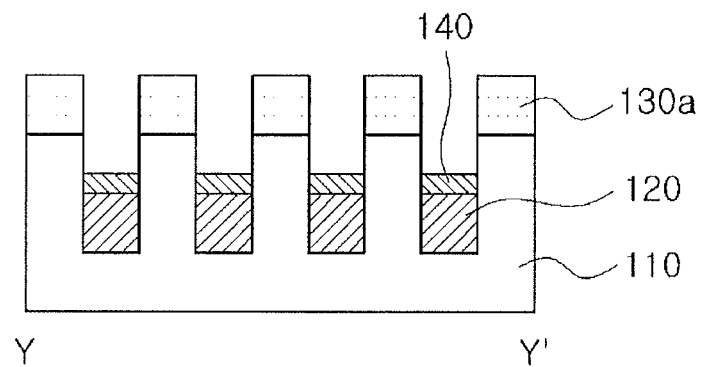
Figure 5H:
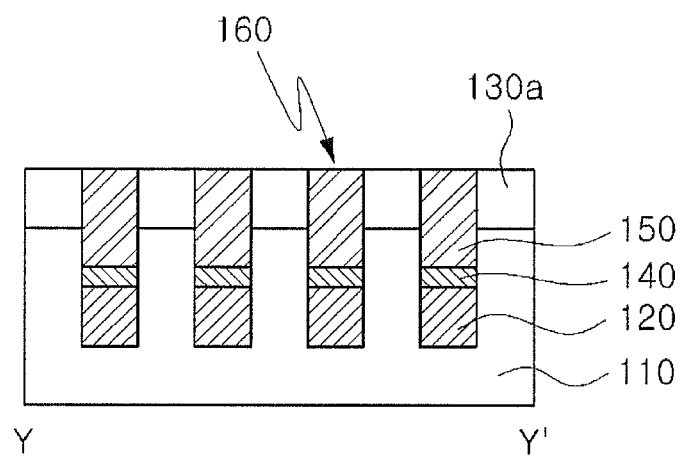

FIG. 1 is a perspective view showing a switching element for a memory device according to an embodiment of the present invention.

As shown in FIG. 1, a switching element 160 according to an embodiment of the present invention includes a base layer 110 having a plurality of trenches 110a; and first insulation patterns 130a formed on the base layer 110 excluding the plurality of trenches 110a. Preferably, the switching element includes a base layer 110 composed of an oxide film and provided with a plurality of trenches with the base of the trench forming a right angle with the side surface of the trench. The first insulation patterns 130a are composed of any one of an amorphous carbon film, a nitride film, a silicon nitride film, and a poly film.

First diode portions 120 composed of a metal thin film are formed on bottoms of the trenches 110a. In an embodiment, the first diode components 120 are made of any one of aluminum (Al), tungsten (W), cobalt (Co), nickel (Ni) and copper (Cu). Second insulation patterns 130d are disposed on the first diode portions 120 of each of the trenches 110a. The second insulation patterns 130d are spaced apart from each other so as to form holes in the trenches 110a that are provided with the first diode portions 120. In an embodiment, the second insulation patterns 130d are composed of an oxide film.

Square pillar-shaped second diode portions 150 are formed in the holes over the first diode portions 120. In an embodiment, the square pillar-shaped second diode portions 150 are composed of a P-type polysilicon film or an N-type poly silicon film. Thus, Schottky diodes, each of which is a switching element having a laminate structure of the first diode portion 120 and second diode portion 150 are formed with the upper end of each Schottky diode having a square pillar shape. Further, barrier films 140 may be formed respectively between the first diode portions 120 and the second diode portions 150. In an embodiment, the barrier films are composed of any one of a titanium silicide ($TiS_{i2}$) film, a tungsten silicide ($WS_{i2}$) film, a cobalt silicide ($CoS_{i2}$) film, a nickel silicide ($NiS_{i2}$) film and a titanium nitride (TiN) film, are formed between the respective first diode portions 120 and second diode portions 150.

Meanwhile, in the afore-mentioned switching element for a memory device, the switching element according to an embodiment of the present invention may have a laminate structure of an oxide film and a metal film or a laminate structure of an N-type silicon film and a P-type silicon film instead of a laminate structure of a metal film and P-type silicon film or a laminate structure of a metal film and an N-type silicon film.

As described above, the switching element for a memory device according to an embodiment of the present invention includes the first diode portions 120 formed in the form of a thin film in the plurality of trenches 110a provided in the base layer 110, and the second diode portions 150 formed in the form of a square pillar in the holes.

Therefore, the phase-change memory device according to an embodiment of the present invention can be provided with diodes having a larger cross-sectional area when compared to cylindrical diodes used as a switching element, and thus it is expected that current characteristics are improved.

Furthermore, the switching element for a memory device according to an embodiment of the present invention can control the misalignment of diodes and a base layer, in contrast to when cylindrical diodes are used as a switching element.

FIGS. 2A to 2H are perspective views shown for explaining a method of manufacturing a switching element for a phase-change memory device according to an embodiment of the present invention, FIGS. 3A to 3H are plan views shown for explaining a method of manufacturing a switching element for a phase-change memory device according to an embodiment of the present invention, FIGS. 4A to 4H are cross-sectional views shown for explaining a method of manufacturing a switching element for a phase-change memory device taken along the lines X-X' of FIGS. 3A to 3H according to an embodiment of the present invention, and FIGS. 5A to 5H are cross-sectional views shown for explaining a method of manufacturing a switching element for a phase-change memory device taken along the lines Y-Y' of FIGS. 3A to 3H according to an embodiment of the present invention.

In the embodiments of the present invention, among methods of manufacturing a switching element for a memory device, a method of manufacturing a switching element for a phase-change memory device will be shown and described.

Referring to FIGS. 2A, 3A, 4A and 5A, line-type hard mask patterns 130a are formed on a base layer 110 made of an oxide at regular intervals such that they are spaced apart from each other. In an embodiment, the hard mask patterns 130 are composed of any one of an amorphous carbon film, a nitride film, a silicon nitride film and a poly film. Preferably, the hard mask patterns are composed of a nitride film.

Referring to FIGS. 2B, 3B, 4B and 5B, a plurality of line-type trenches 110a are formed by etching the base layer 110 left exposed by the hard mask patterns 130a using the hard mask patterns 130a as an etching mask. The trenches 110a are formed to have a right-angled inclination (90°) in which the base of the trench forms a right angle with the side surface of the trench.

Referring to FIGS. 2C, 3C, 4C and 5C, a first diode portion 120 is formed in the form of a thin film on the bottom of each of the trenches 110a by embedding a first diode forming material in the trenches 110a and then etching the first diode forming material. In an embodiment, the first diode portions 120 are composed of a metal film made of any one selected from among aluminum (Al), tungsten (W), cobalt (Co), nickel (Ni) and copper (Cu), preferably tungsten (W).

Referring to FIGS. 2D, 3D, 4D and 5D, an insulation material 130b made of an oxide is buried in the trenches 110a (which has the first diode portions 120 provided therein) and then flattened until the hard mask patterns 130a are exposed. Here, the hard mask patterns 130a composed of a nitride film serve as an etch stop film at the time of flattening the insulation material 130b.

Referring to FIGS. 2E, 3E, 4E and 5E, line-type mask patterns, for example, photosensitive film patterns 130c are formed on the hard mask patterns 130a and the insulation material 130b in a direction perpendicular to the hard mask patterns 130a. The line-type mask patterns are spaced apart from each other at regular intervals.

Referring to FIGS. 2F, 3F, 4F and 5F, a plurality of holes 110b through which the surfaces of the first diode portions 120 are exposed are formed by removing the insulation material 130b exposed by the photosensitive film patterns 130c, and then the photosensitive film patterns 130c are removed. Here, when the insulation material 130b is removed through an etching process, due to the etching selection ratio of the hard mask patterns 130a and insulation material 130b, the hard mask patterns 130a composed of a nitride film are not etched, whereas the insulation material 130 made of oxide is etched. As a result, insulation patterns 130d are formed in the trenches 110a (which have the first diode portions 120 provided therein) such that they are spaced apart from each other; and simultaneously, rectangular holes 110b are formed in the trenches 110a by the hard mask patterns 130a and insulation patterns 130d.

In the embodiments of the present invention, since the holes 110b are formed through an etching process using the line-type hard mask patterns 130a and photosensitive film patterns 130c, during the process of forming the holes 110b which are diode formation regions of a phase-change memory device, an exposure process can be skipped when compared to a conventional hole forming process. Therefore, at the time of manufacturing a phase-change memory device, processes can be simplified and manufacturing costs can be reduced.

Referring to FIGS. 2G, 3G, 4G and 5G, in an embodiment barrier layers 140 are formed in the bottom of the holes 110b, that is, on the respective first diode portions 120 formed on the bottoms of the trenches 110a. In an embodiment, the barrier layers 140 are made of any one of titanium silicide ($TiSi_2$), tungsten silicide ($WSi_2$), cobalt silicide ($CoSi_2$), nickel silicide ($NiSi_2$) and titanium nitride (TiN).

Referring to FIGS. 2H, 3H, 4H and 5h, a second diode forming material is buried in the holes 110b (which has the barrier layer 140 provided therein) and then flattened until the hard mask patterns 130a are exposed, and thus square pillar-shaped second diode portions 150 are formed in the holes 110b; thereby completing Schottky diodes, each of which is a switching element having a laminate structure of the first diode portion 120 and second diode portion 150. Preferably, when the second diode portions 150 are composed of a P-type polysilicon film; P-type Schottky diodes, each having a laminate structure of a metal film and a P-type polysilicon film, can be formed; and when the second diode portions 150 are composed of an N-type polysilicon film; N-type Schottky diodes, each having a laminate structure of a metal film and an N-type polysilicon film, can be formed.

Meanwhile, in the aforementioned embodiments of the present invention, a switching element for a phase-change memory device is manufactured using Schottky diodes with each having a laminate structure of a metal film and a polysilicon film. Alternatively, the switching element may be manufactured using diodes, each having a laminate structure of an oxide film and a metal film; and may be manufactured using diodes, each having a laminate structure of an N-type polysilicon film and a P-type polysilicon film.

In the aforementioned method of manufacturing a switching element for a phase-change memory device according to an embodiment of the present invention; holes, which are switching element forming regions, are formed through a patterning process using hard mask patterns and photosensitive film patterns, and thus an exposure process can be skipped when compared to a conventional hole forming process.

Further, according to the present invention, since holes, which are switching element forming regions, are not formed through an exposure process, the misalignment of the holes and a base layer can be overcome even when a memory device is highly integrated.

Furthermore, according to the present invention, since Schottky diodes having low resistance are used to manufacture a switching element, the number of strings of diodes in one cell can be increased, thus realizing the reduction of cell size.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a switching element for a memory device, comprising the steps of:
    forming line-type hard mask patterns spaced apart from each other at regular intervals on a base layer;
    etching the base layer exposed by the line-type hard mask patterns to form a plurality of line-type trenches;
    forming first diode portions on the bottoms of the trenches;
    embedding an insulation material in the trenches having the first diode portions therein;
    forming line-type mask patterns spaced apart from each other at regular intervals on the line-type hard mask patterns and the insulation material in a direction perpendicular to the line-type hard mask patterns;
    removing the insulation material exposed by the line-type mask patterns to form holes exposing surfaces of the first diode portions;
    removing the line-type mask patterns; and
    forming second diode portions in the holes.

2. The method of manufacturing a switching element for a memory device according to claim 1, wherein the step of forming first diode portions comprises embedding a first diode forming material in each of the trenches and etching the first diode material so as to form the first diode portion such that it extends the length of the trench in each of the trenches.

3. The method of manufacturing a switching element for a memory device according to claim 2, wherein the insulation material comprises oxides.

4. The method of manufacturing a switching element for a memory device according to claim 1, wherein the base layer comprises an oxide film.

5. The method of manufacturing a switching element for a memory device according to claim 1, wherein the line-type hard mask patterns are formed with one of an amorphous carbon film, a nitride film, a silicon nitride film, and a poly film.

6. The method of manufacturing a switching element for a memory device according to claim 1, wherein the first diode portions comprise a metal material.

7. The method of manufacturing a switching element for a memory device according to claim 6, wherein the metal material comprises any one of aluminum (Al), tungsten (W), cobalt (Co), nickel (Ni) and copper (Cu).

8. The method of manufacturing a switching element for a memory device according to claim 1, wherein the line-type mask patterns comprises photosensitive film patterns.

9. The method of manufacturing a switching element for a memory device according to claim 1, further comprising the step of: forming barrier layers on the first diode portions, between the step of removing the line-type mask patterns and the step of forming the second diode portions in the holes.

10. The method of manufacturing a switching element for a memory device according to claim 9, wherein the barrier layers comprise any one of titanium silicide ($TiSi_2$), tungsten silicide ($WSi_2$), cobalt silicide ($CoSi_2$), nickel silicide ($NiSi_2$) and titanium nitride (TiN).

11. The method of manufacturing a switching element for a memory device according to claim 1, wherein the second diode portions comprise a P-type polysilicon film or an N-type polysilicon film.

* * * * *